United States Patent [19]

Statman et al.

[11] Patent Number: 4,771,250

[45] Date of Patent: Sep. 13, 1988

[54] DIGITAL PHASE-LOCK LOOP HAVING AN ESTIMATOR AND PREDICTOR OF ERROR

[75] Inventors: Joseph I. Statman, North Hollywood; William J. Hurd, La Canada, both of Calif.

[73] Assignee: United States of America as represented by the Administrator, National Aeronautics and Space Adminstration, Washington, D.C.

[21] Appl. No.: 84,770

[22] Filed: Aug. 13, 1987

[51] Int. Cl.⁴ .............................................. H03L 7/08
[52] U.S. Cl. ...................................... 331/17; 331/25; 328/155
[58] Field of Search ........................... 331/1 A, 17, 25; 328/155

[56] References Cited

U.S. PATENT DOCUMENTS

| | | | |
|---|---|---|---|
| 4,418,318 | 11/1983 | Swagerty et al. | 328/155 |
| 4,577,163 | 3/1986 | Culp | 331/1 A |
| 4,712,223 | 12/1987 | Nelson | 331/1 A X |

Primary Examiner—Siegfried H. Grimm
Attorney, Agent, or Firm—Paul F. McCaul; John R. Manning; Thomas H. Jones

[57] ABSTRACT

A digital phase-lock loop (DPLL) which generates a signal with a phase that approximates the phase of a received signal with a linear estimator. The effect of a complication associated with non-zero transport delays related to DPLL mechanization is then compensated by a predictor. The estimator provides recursive estimates of phase, frequency, and higher order derivatives, while the predictor compensates for transport lag inherent in the loop.

3 Claims, 9 Drawing Sheets

DIGITAL PHASE-LOCK LOOP HAVING AN ESTIMATOR AND PREDICTOR OF ERROR

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to a digital phase-lock loop (DPLL), and more particularly to a DPLL in which the transfer function of the loop is comprised of an estimator and a predictor of error.

Figure 1:
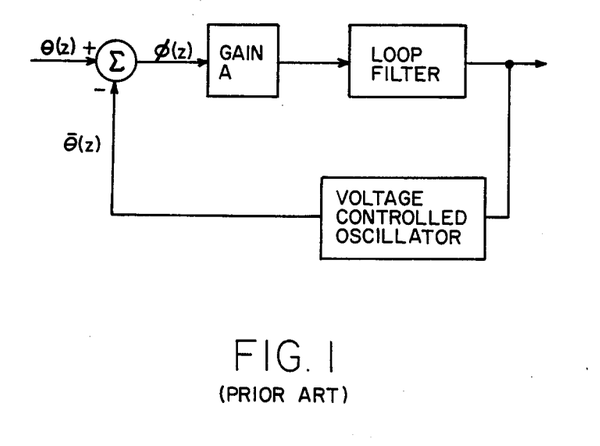
FIG. 1 illustrates a prior-art phase lock loop (PLL).

A phase locked loop (PLL) is a feedback system that tracks the phase of a received quasi-periodic signal. A typical PLL structure is shown in FIG. 1. The difference between the received phase and a voltage controlled oscillator (VCO) phase is filtered and used to so adjust the VCO that the VCO phase tracks the received phase.

Designers of PLL's select a loop filter to meet performance requirements, usually specified in terms of bandwidth, gain margin, and dynamic errors. Design methods are well documented in the literature. Gardner, F. M., *Phaselock Techniques*, John Wiley and Sons, (1979). Best, R. E., *Phase Locked Loops, Theory, Design and Applications*, McGraw Hill, (1984). Viterbi, A. J., *Principles of Coherent Communication*, McGraw Hill (1966).

What is of interest here is a digital phase-lock loop (DPPL) characterized by constant loop update rates. For a discussion of DPLLs with variable loop update rate, see Gill, G. S., and Gupta, S. C., "First Order Discrete Phase Locked Loops with Applications to Demodulation of Angle Modulated Carrier", IEEE Trans. on Communications, June 1972; Weinberg, A. and Liu, B., "Discrete Time Analysis of Nonuniform Sampling First-and-Second-Order Digital Phase Locked Loops", IEEE Trans. on Communications, February 1974; Osborne, H. C., "Stability Analysis of Nth Power Digital Phase Locked Loop—Part I: First Order DPLL", IEEE Trans. on Communications, August 1980; Osborne, H. C., "Stability Analysis of Nth Power Digital Phase Locked Loop—Part II: Second and Third Order DPLLs", IEEE Trans. on Communications, August 1980. DPPLs with fixed update rate are often designed either by analogy to continuous time domain PLLs, or based on an optimality criterion.

Design by analogy to continuous domain PLLs, i.e., applying s-plane design rules by translation to the z-plane, suffers from two major disadvantages. The design is based on iteratively placing open-loop poles and zeroes at "well chosen" locations until satisfactory performance is achieved. Such locations are selected based on design experience rather than on well established set of rules. Also, the design does not account for the transport delay in the digital loop, caused by hardware delays and loop filter computations. This delay is either "tolerated," i.e., the degradation due to the delay is analyzed and found to be acceptable or "compensated" by the equivalent of a lead-lag network. This design procedure is usually acceptable only when the loop update rate is very high compared to the loop bandwidth.

Design based on an optimality criterion as discussed, for example, by Gupta, S. C., "On Optimum Digital Phase-Locked Loops", IEEE Transactions on Communications Technology, Vol 16, No. 2, April 1968, attempts to optimize a concise performance measure, such as a weighted sum of integrated transient response, gain margin, and noise variance. For some cases, analytical expressions for the performance measure can be obtained, and closed-form expressions for loop filters defined. Disadvantages are that the loop filter form (e.g., order of loop) is not defined apriori, but rather is a result of the optimization procedure, and that the design procedure is complex.

The estimator-predictor approach described in this application offers an alternate design for DPLLs. The DPLL design presented here is shown to be equivalent to an estimator followed by a predictor compensating for the transport lag. The estimator incorporates past measurements of phase into a state vector estimate, consisting of phase, frequency, and perhaps higher derivatives. Selection of an estimator can utilize the base resources available in linear optimal estimation theory.

SUMMARY OF THE INVENTION

In accordance with the present invention, the basic purpose of a DPLL (to generate a signal with a phase that approximates the phase of a received signal) is accomplished with a linear estimator. The effect of a complication associated with non-zero transport delays related to DPLL mechanization is then compensated by a predictor. The estimator provides recursive estimates of phase, frequency, and higher order derivatives, while the predictor compensates for the transport lag inherent in the loop. The closed-loop DPLL transfer function has the form $$H(z) = C(z)D(z)z^{-N}$$

where H(z) is the closed-loop DPLL transfer function, C(z) is the estimator transfer function, D(z) is the predictor function, and $z^{-N}$ is the DPLL transport lag in units of loop update time. A phase detector with gain A is used to implement this equation in a closed-door DPLL. Thus, the transfer function H(z) is given by the above equation only where the phase detector has a nominal gain value of A=1. One realization of the estimator, predictor and delay is comprised of a digital filter having a transfer function S(z) and a numerical control oscillator having a transfer function Q(z), where S(z) satisfies.

$$S(z) = \frac{C(z)\ D(z)}{Q(z)} z^{-N}$$

In a preferred embodiment, a detector and a numerical control oscillator are implemented with hardware in a direct connection to the digital filter implemented in a programmed digital computer in which the function Q(z) of a numerical control oscillator is implemented as part of the computer program. This decomposition of the DPLL closed-loop transfer function results in a straightforward loop filter design, enabling use of techniques from optimal and sub-optimal estimation theory.

DESCRIPTION OF PREFERRED EMBODIMENTS

The basic purpose of a DPLL is to generate a signal with phase $\bar{\theta}(z)$ that approximates $\theta(z)$, the phase of a received signal. From the viewpoint of linear estimation theory, this is an estimation problem, and the solution is found by the following procedure. First a linear state model for $\theta(z)$ is defined, with a corresponding measurement model. Then, statistical models for state (or process) noise and measurement noise are developed. Finally, some type of optimal estimator is selected such as a recursive least squares estimator.

There is a slight complication since a non-zero transport delay is associated with DPLL mechanization. The effect of this delay is compensated by a predictor that extrapolates the state estimate by an appropriate time interval. Thus, the closed-loop DPLL transfer function has the form:

$$H(z) = C(z)D(z)z^{-N} \quad (1)$$

where H(z) is the closed-loop DPLL transfer function, C(z) is the estimator transfer function, D(z) is the predictor transfer function, and $z^{-N}$ is the DPLL transport lag in units of loop update time. It is assumed here that the DPLL is updated at uniformly spaced time points, with update interval of T, hence the transport lag is an integer multiple of T.

Figure 2:
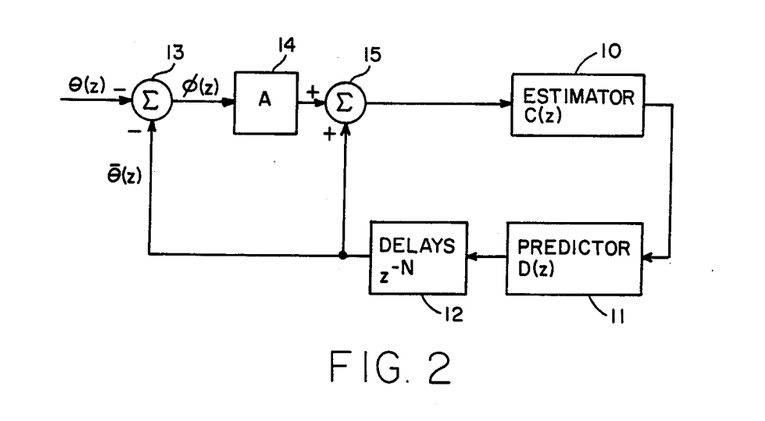
FIG. 2 illustrates a functional block diagram of a digital phase-lock loop organized in accordance with the present invention.

FIG. 2 shows a DPLL functional block diagram that addresses eq. (1). The three functional blocks 10, 11 and 12 on the right are the elements of H(z), namely an estimator C(z), a predictor D(z), and an inherent transport lag $z^{-N}$. In addition, the figure incorporates a phase detector 13 with gain A represented by block 14 and a summer 15. Note that when the phase detector gain has a nominal value of A=1, the feedback is cancelled, and the closed loop transfer function is H(z) given by eq. (1). The closed loop transfer function, for general phase detector gain, is denoted P(z).

Figure 3:
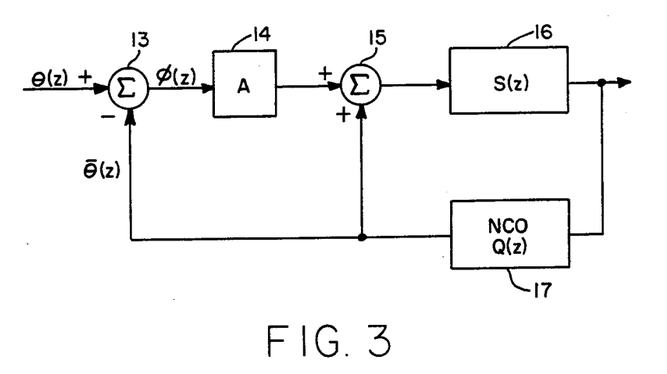
FIG. 3 is a block diagram which may be readily implemented from the functional block diagram of FIG. 2.

The functional diagram shown in FIG. 2 is readily implemented in accordance with a block diagram presented in FIG. 3. The estimator-predictor-delay combination is replaced by actual components: a digital filter 16 having a transfer function S(z), and a numerically controlled oscillator (NCO) 17 having a transfer function Q(z), where S(z) satisfies:

$$S(z) = \frac{C(z)D(z)}{Q(z)} z^{-N} \quad (2)$$

Figure 4:
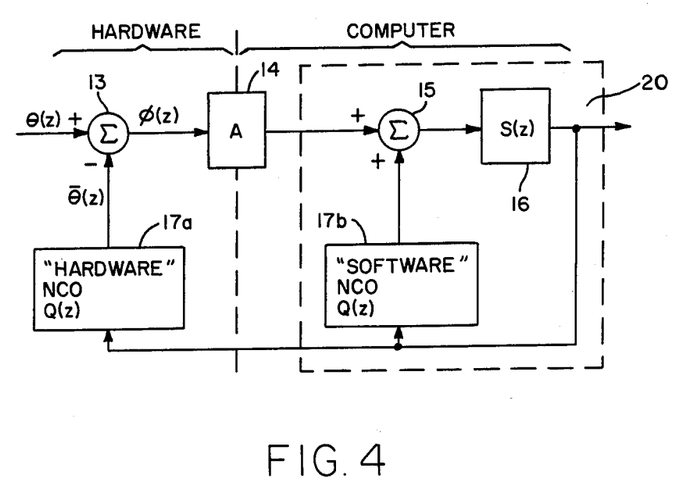
FIG. 4 illustrates a hybrid software and hardware implementation of the DPLL shown in FIG. 3.

FIG. 4 illustrates a preferred DPLL implementation. The phase detector 13 and "hardware" NCO 17a are implemented with hardware, while the summer 15, digital filter 16, and a "software" NCO 17b are implemented with a programmed computer. Both "hardware" NCO and "software" NCO have identical mathematical representations, as the latter simulates the operation of the former. When comparing FIGS. 1 and 4, it is apparent that the function of a loop filter in a PLL of FIG. 1 is performed by a minor loop 20 in FIG. 4 implemented in the computer-resident portion of the DPLL.

The design of a DPLL conforming to FIGS. 2, 3 and 4 can be divided into five distinct steps. The first step is to select a model for the received phase process. This model can include the process dynamics and statistics on process noises and measurement noise. The second step is to model the "hardware" NCO 17a, transport lag 12, and phase detector 13. As shown below, the transport lag may be incorporated as part of the transfer function Q(z) of the NCO 17b.

The next step is selection of an estimator 10, based on the phase model and the process noise and measurement noise covariance matrices. Possible realizations of the estimator are some variations of Kalman filters, or other least squares estimators. The fourth step is determination of a predictor to compensate for transport lag. The last, but definitely not the least, step is to assure that the loop is stable.

Two separate models are used for received phase. The first model has two state variables: phase and frequency, while the second model uses three-state variables: phase, frequecy and frequency rate. These models are addressed below as second-and third-order models, respectively. The time-invariant phase models are expressed as:

$$x_n = \Phi x_{n-1} + v_{n-1} \quad (3)$$

$$y_n = H x_n + u_n \quad (4)$$

where $x_n$ is the state vector, $y_n$ is the measurement, $\Phi$ is the state transition matrix, $u_n$ is the measurement noise, and $v_{n-1}$ is the state, or process noise. Expressions for $\Phi$, H, and the measurement covariance, R, are presented in Table 1. Since only phase is measured, R is a scalar.

TABLE 1

| | Matrices for time invariant signal model | |
|---|---|---|
| | Second order | Third order |
| $\Phi$ | $\begin{pmatrix} 1 & T \\ 0 & 1 \end{pmatrix}$ | $\begin{pmatrix} 1 & T & T^2/2 \\ 0 & 1 & T \\ 0 & 0 & 1 \end{pmatrix}$ |
| H | (1,0) | (1,0,0) |
| R | $(\sigma_u^2)$ | $(\sigma_u^2)$ |

Model of Phase Detector and NCO

The phase detector inputs are actually time continuous signals. The phase detector measures the average phase difference between the phase of the input process and the NCO phase. This is equivalent to the difference between the average input phase and the average NCO phase. Thus, $\theta(z)$ represents the input phase, averaged over the measurement interval, and $\overline{\theta}(z)$ represents the NCO phase, averaged over the same interval.

Hurd and Aguirre, and Simon and Mileant, cited above, discuss a general form for a DPLL NCO. The NCO is updated gT seconds after the phase measurement is made, where T is the loop update interval and $0 \leftarrow g \leftarrow 1$. The case $g=0$ corresponds to NCO update immediately following the measurement, while $g=1$ is caused by a T seconds delay before the NCO update. Such a delay occurs in practical systems while the computer determines the next NCO input. The transfer function Q(z) is the transfer function between the NCO input, and the average NCO phase at the next measurement, including all delays. This transfer function is:

$$Q(z) = T \frac{(10g)^2 z^2 + (1 + 2g - 2g^2)z + g^2}{2z^2(z-1)} \quad (5)$$

In particular, for the cases $g=0$ and $g=1$, Q(z) has the simple forms:

$$g = 0 \quad Q(z) = \frac{T}{2} \frac{z+1}{z-1} z^{-1} \quad (6)$$

$$g = 1 \quad Q(z) = \frac{T}{2} \frac{z+1}{z-1} \quad (7)$$

Note that in equations (6) and (7), the NCO function can be separated into two parts: integer number of delays, and a kernal, $Q_1(z)$. $Q_1(z)$ is characterized by numerator and denominator of the same degree. The cases of $g=0$ and $g=1$ are then examples of $N=1$ and $N=2$ computational delays, respectively. The general expressions for a delay of N update times is:

$$Q(z) = \frac{T}{2} \frac{z+1}{z-1} z^{-N} = Q_1(z) z^{-N} \quad (8)$$

In particular, cases with $N=3, 4 \ldots$ corresponds to pipelined feedback computations.

Selection of an Estimator

For this example, a least squares, fading memory estimator, with fixed gains, is selected. Such an estimator, described by Statman, J., "Simplified Solution for a Class of Fading Memory Filters," submitted to IEEE Transactions on Aerospace and Electronic Systems, computes a state estimate based on a set of measurements, applying an exponentially decaying weight to past data. This "aging function" effectively discards measurements that are older than three or four estimator time constants. The steady state fading memory solution for equations 3-4, derived in Statmen, cited above, for a specific form of the process noise covariance matrix is:

$$\overline{x}_{n,n} = \Phi \overline{x}_{n-1,n-1} + \overline{K}(y_n - H \Phi \overline{x}_{n-1,n-1}) \quad (9)$$

$$\overline{K} = \overline{M}^{-1} H^T R^{-1}$$

where $R^{-1}$ is the measurement noise covariance matrix and $\overline{M}$ is the solution for the linear matrix equation:

$$M = H^T R^{-1} H + \alpha \Phi^{-T} \overline{M} \Phi^{-1} \quad (10)$$

$$\alpha = e^{-T/\tau}$$

The parameter $\tau$ is denoted the filter time constant. Using these equations, a z-plane filter transfer function can be evaluated. For a filter with m inputs (measurements) and n outputs (states), the transfer function is a matrix C(z) with n rows and m columns. C(z) can be computed from:

$$C(z) = (zI - \Phi + \overline{K} H \Phi)^{-1} \overline{K} z \quad (11)$$

Table 2 summarizes the elements of the transfer function. Since only phase measurements are used, the transfer functions are column vectors. Note that all the transfer functions poles are at $z = -\alpha$ within the unit circle, hence assuring filter stability.

TABLE 2

| State parameter | Transfer functions from input phase to state parameter | |
|---|---|---|
| | Second order | Third order |
| Phase | $\dfrac{(1 - \alpha^2)z\left(z - 2\dfrac{\alpha}{1+\alpha}\right)}{(z-\alpha)^2}$ | $\dfrac{(1-\alpha)z((\alpha^2 + \alpha + 1)z^2 - 3\alpha(1+\alpha)z + 3\alpha^2)}{(z-\alpha)^3}$ |
| Frequency | $\dfrac{(1-\alpha)^2 z(z-1)}{T(z-\alpha)^2}$ | $\dfrac{(1-\alpha)z(z-1)((3-3\alpha^2)z + 5\alpha^2 - 4\alpha - 1)}{2T(z-\alpha)^3}$ |
| Acceleration | — | $\dfrac{(1-\alpha)^3 z(z-1)^2}{T^2(z-\alpha)^3}$ |

Selection of a Predictor

The predictor generates a phase predict by extrapolating from the current phase estimate using either an estimate of frequency for a second-order model, or estimates of frequency and frequency rate for a third-order model. The extrapolation time, NT, is the number of integer delays in the loop multiplied by the update interval. Predictor equations are given in Table 3.

TABLE 3

| | Predictor formulas | |
|---|---|---|
| | Second order | Third order |
| D(z) | (1,NT) | $\left(1, NT, \dfrac{(NT)^2}{2}\right)$ |

Loop Transfer Functions

Recall that the transfer function H(z) equals $D(z)C(z)z^{-N}$. Thus, in the example, H(z) depends only on the order of the phase model, the number of delays, and the estimator decay factor, $\alpha$. The open loop, closed loop, and error transfer functions (G(z), P(z) and E(z), respectively) for the DPLL, are easily expressed in terms of the function $E_1(z) = 1 - H(z)$:

$$G(z) = \frac{\bar{\theta}(z)}{\Phi(z)} = \frac{AH(z)}{1 - H(z)} = \frac{A(1 - E_1(z))}{E_1(z)} \quad (12)$$

$$P(z) = \frac{\bar{\theta}(z)}{\theta(z)} = \frac{G(z)}{1 + G(z)} = \frac{AH(z)}{1 + (A - 1)H(z)} = \frac{A(1 - E_1(z))}{1 + (A - 1)(1 - E_1(z))} \quad (13)$$

$$E(z) = \frac{\Phi(z)}{\theta(z)} = 1 - P(z) = \frac{E_1(z)}{1 + (A - 1)(1 - E_1(z))} \quad (14)$$

where $\Phi(z)$ is the z-transform of the phase out of the phase detector, not including phase detector gain, i.e., $\Phi(z) = \bar{\theta}(z) - (\theta(z))$. Expressions for $E_1(z)$ are presented in Table 4.

TABLE 4

| N | Formulas for $E_1(z)$ | |
|---|---|---|
| | Second order | Third order |
| 1 | $\dfrac{(z-1)^2}{(z-\alpha)^2}$ | $\dfrac{(z-1)^3}{(z-\alpha)^3}$ |
| 2 | $\dfrac{(z-1)^2}{(z-\alpha)^2} \dfrac{z + 2(1-\alpha)}{z}$ | $\dfrac{(z-1)^3}{(z-\alpha)^3} \dfrac{z + 3(1-\alpha)}{z}$ |
| 3 | $\dfrac{(z-1)^2}{(z-\alpha)^2} \dfrac{z^2 + 2(1-\alpha)z + (\alpha^2 - 4\alpha + 3)}{z^2}$ | $\dfrac{(z-1)^3}{(z-\alpha)^3} \dfrac{z^2 + 3(1-\alpha)z + (3\alpha^2 - 9\alpha + 6)}{z^2}$ |

A special case of interest occurs when the phase detector gain, A, has its nominal value $A = 1$. Then:

$$G(z) = \frac{H(z)}{E_1(z)}, \quad P(z) = H(z), \quad E(z) = E_1(z) \quad (15)$$

Realizability and Stability

The DPLL structure of FIG. 4 has three blocks that need to be realized: a "hardware" NCO, a "software" NCO and a digital filter $S(z)$. The "hardware" NCO is realizable by definition. The "software" NCO is a mere simulation of the "hardware" NCO function and is thus realizable. This leaves the digital filter $S(z)$. A necessary and sufficient condition for the realizability of this filter is that the order of the numerator is less or equal to that of the denominator. Oppenheim, A. V. and Schafer, R. W. "Digital Signal Processing", Prentice-Hall, N.J. 1975. Recall, from equations (2) and (8) that $S(z) = D(z)C(z)/Q_1(z)$. Since the above condition is satisfied for each component of $C(z)$, it is also true for $D(z)C(z)$ (the predictor merely computes a fixed weight sum of components of $C(z)$). The above condition is also satisfied for $1/Q_1(z)$ (eq. (8)). Thus, $S(z)$ is realizable.

The following restricts the stability discussion to the nominal operating point, $A = 1$, with analysis of the range of stable operating conditions deferred to the next section. When $A = 1$, the closed loop function is:

$$P(z) = H(z) = 1 - E_1(z) \quad (16)$$

Equation (16), combined with Table 4, shows that $P(z)$ has poles at $z = \alpha$ and at $z = 0$. Since $\alpha$ is real and satisfies $0 < \alpha < 1$, all the poles of $P(z)$ are inside the unit circle and the closed loop transfer function is stable. Gain margin is computed in the next section.

Even though $P(z)$ is stable, special care must be exercised in the implementation of $S(z)$. Note that $Q_1(z)$ has a zero at $z = -1$, thus, $S(z)$ has a pole at that point. This means that $S(z)$, were it not a part of the feedback loop, would be marginally stable. $H(z)$ is stable since the pole at $z = -1$, contributed by $S(z)$, is cancelled by the zero of $Q(z)$ at the same location. To maintain numerical stability, this pole of $S(z)$ may be moved slightly into the unit circle. The next section demonstrates that this shift in pole location has negligible effect on loop performance.

Performance Analysis

In this section performance of the loops is analyzed. First, loop type and error due to dynamics of the received phase are evaluated, then loop bandwidths are determined. And finally, gain margins are computed. The discussions of dynamic error and loop bandwidth are for the nominal operating point, $A = 1$.

(1) Loop Type and Dynamic Tracking Errors

Loop type is the number of integrators in the open loop transfer function, i.e., the number of poles at $z = 1$. From equation (12), observe that the poles of the open loop transfer function are the same as the zeros of $E_1(z)$. Table 4 presents $E_1(z)$ for the second order and third order phase models, showing that $E_1(z)$ has as many zeros at $z = 1$ as the order of the estimator, i.e., second and third order phase models correspond to type II and type III loops, respectively. Note that while loop type is independent of the number of computational delays, the order of the transfer functions strongly depends on the number of delays. Specifically, the orders of the numerator and denominator of $E_1(z)$ are equal to the loop type plus $N - 1$, where N is the number of delays.

The steady state phase error for constant dynamics is computed using the final value theorem:

$$E_a = \lim_{z \to 1} \frac{z - 1}{z} E(z)\theta(z) \quad (17)$$

Figure 5:
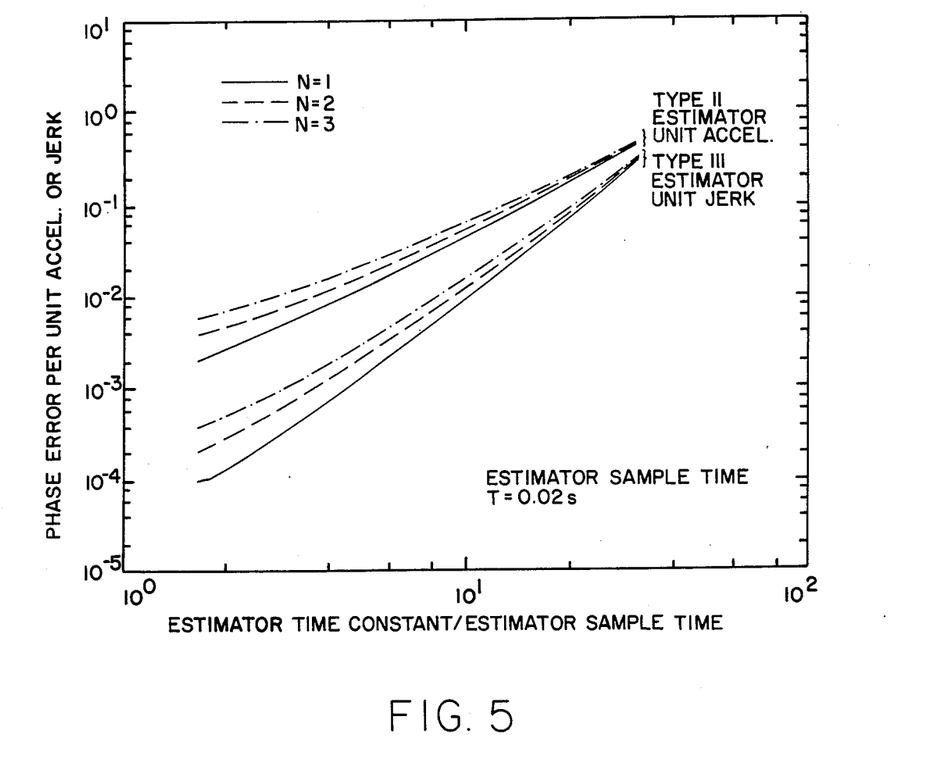
FIG. 5 is a graph of dynamic phase error versus estimator parameters.

A type II loop has zero phase error for phase ramp, constant (non zero) phase error for phase acceleration, and infinite phase error for phase jerk, or higher dynamics. In a similar way, a type III loop has zero, constant, and infinite phase errors for phase acceleration, jerk, and higher dynamics, respectively. Thus the dynamics of interest are phase acceleration for a type II loop, and phase jerk for type III loop. Table 5 lists the steady state phase errors for the types II and III loops, at the operating point, $A = 1$. FIG. 5 shows these phase errors as function of the estimator time constant. The inputs are unit phase acceleration, e.g., rad/s$^2$ or m/s$^2$, for the type II loop and unit phase jerk for the type III loop, and the errors are in consistent units of rad or m, respectively. Note that as the estimator time constant increases, the phase error increases. In fact, for $T<<\tau$ and $N=1$, the normalized phase errors are $\tau^2$ and $\tau^3$ for the type II and type III loops, respectively. The phase error also increases slightly with the increase in the number of delays. This is caused by the increased prediction error.

TABLE 5

Steady state phase errors due to dynamics (phase errors)

| N | Second Order Estimator $\left(\theta(t) = \frac{1}{2} t^2\right)$ | Third Order Estimator $\left(\theta(t) = \frac{1}{6} t^3\right)$ |
|---|---|---|
| 1 | $\dfrac{T^2}{(1-\alpha)^2}$ | $\dfrac{T^3}{(1-\alpha)^3}$ |
| 2 | $\dfrac{T^2}{(1-\alpha)^2}(3-2\alpha)$ | $\dfrac{T^3}{(1-\alpha)^3}(4-3\alpha)$ |
| 3 | $\dfrac{T^2}{(1-\alpha)^2}(\alpha^2 - 6\alpha + 6)$ | $\dfrac{T^3}{(1-\alpha)^3}(3\alpha^2 - 12\alpha + 10)$ |

In using the estimator-predictor formulation, it is important to use a good predictor. For example, if one uses the current phase as the predict, i.e., $$D(z)=(1,0) \text{ or } D(z)=(1,0,0) \tag{18}$$

then both the second order and third order estimators result in type I loops.

(2) Bandwidth Results

The one-sided bandwidth of the loop is defined as:

$$B_L = \frac{1}{2T} \frac{1}{[P(1)^2]} \frac{1}{2\pi j} \int_{\text{unit}} P(z)P(-1)\frac{dz}{z} \tag{19}$$

where P(z) is the closed loop transfer function, and the integral is on the unit circle. At the desired operating point, $A=1$, $P(z)=H(z)$, and the integral can be written as:

$$B_L T = \frac{1}{2} \int_0^1 |H(e^{2\pi j \lambda})|^2 dx \tag{20}$$

Figure 6:
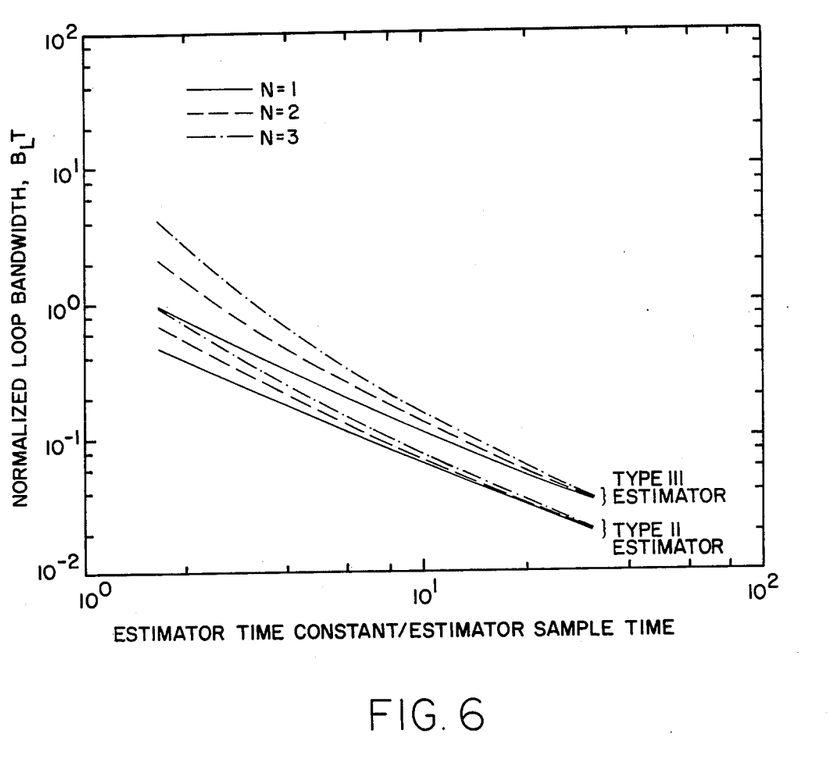
FIG. 6 is a graph of loop bandwidth versus estimator parameters.
Figure 7A:
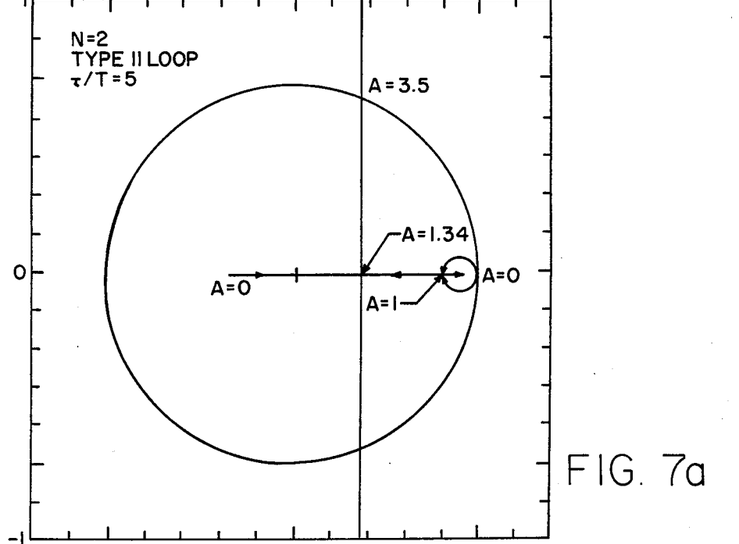
FIGS. 7a to 7d illustrate examples of root loci for:
(a) Second order estimator;
(b) Third order estimator;
(c) Second order estimator, with pole at z=−0.9; and
(d) Third order estimator, with pole at z=−0.9.
Figure 7B:
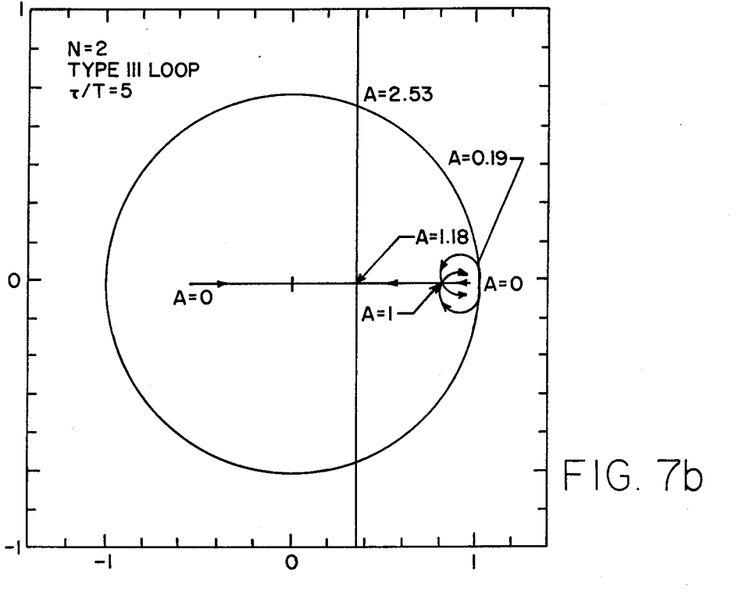
Figure 7C:
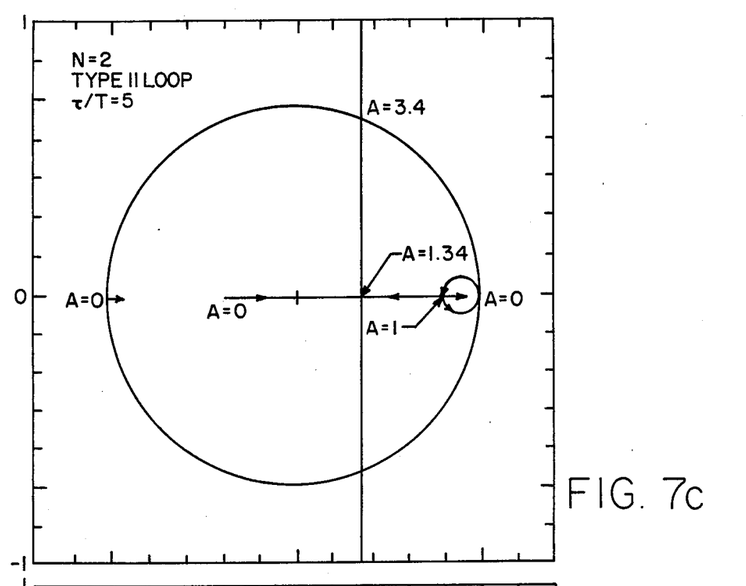
Figure 7D:
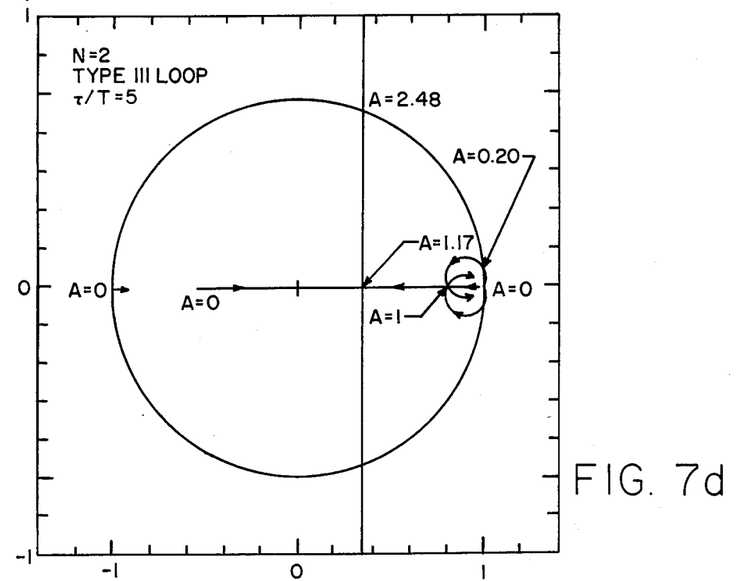

The quantity $B_L T$ is also called the normalized bandwidth. Equation (20) uses the fact that in the example, at $z=1$, H(z) is unity, as can be verified from the definitions in Section 2. The integral was numerically evaluated for different estimators and delays. FIG. 6 shows the loop bandwidth as a function of the estimator time constant and N for type II and type III (second order and third order) estimators. Observe that the introduction of extra delays in the loop increases the noise bandwidth, but the effect of the delays is less significant as the estimator time constant increases.

(3) Stability and Gain Margin

The closed loop root-loci for the designed DPLL will now be discussed, recalling the definition of the open loop transfer function in equation (12). The open loop transfer function G(z) has zeros at the zeros of H(z) and poles at the zeros of $E_1(z)$, thus, with increase of the phase detector gain A, the poles of P(z) move from the zeros of $E_1(z)$ to the zeros of H(z).

FIGS. 7a, 7b, 7c and 7d show root-locus plots for the type II and type III loops, for the case $N=2$. The transfer function $E_1(z)$ has three zeros, two at $z=1$ and one at $z=-2(1-\alpha)$. Observe in FIG. 7a that at low gain, the poles of the closed loop transfer function start at these points; then, as the gain increases, they move within the unit circle. Eventually, with higher gains, the poles of P(z) go outside the unit circle and stability is lost. The root locus for the third order estimator illustrated in FIG. 7b has a similar form, except that at very low gain, roots occur outside the unit circle, near $z=1$.

As shown previously, the designed approach can be marginally stable due to cancellation of a pole of S(z) by a zero of the NCO. To assure stability, this pole at $z=-1$ should be slightly shifted to the inside of the unit circle. Effect of this shift in pole location is demonstrated in FIG. 7c and FIG. 7d. These figures repeat the cases given in FIG. 7a and FIG. 7b, with new pole location at $z=-0.98$. There is an extra root locus branch from $z=-1.0$ toward $Z=-0.98$, with negligible effect on the rest of the root loci. In fact, since the whole root locus branch is inside the unit circle, an arbitrarily small shift in pole location is sufficient to guarantee loop stability. The small shift in pole location has a negligible effect on the other parameters of interest: dynamic phase error, gain margin, and noise bandwidth.

Locations of the poles of the closed loop transfer function at the operating point are of special importance. These poles are commonly selected to be on the real axis so to avoid instability and oscillations when the gain A changes slightly. At the operating point, $A=1$, the closed loop transfer function is H(z). For the estimator-predictor in our example illustrated, H(z) has two or three poles at $z=0$ and two or three co-located poles at $z=\alpha$ for the second and third order estimator, respectively. This feature, real closed loop transfer function poles at the operating point, satisfies the stability criteria often cited by PLL designers.

Figure 8:
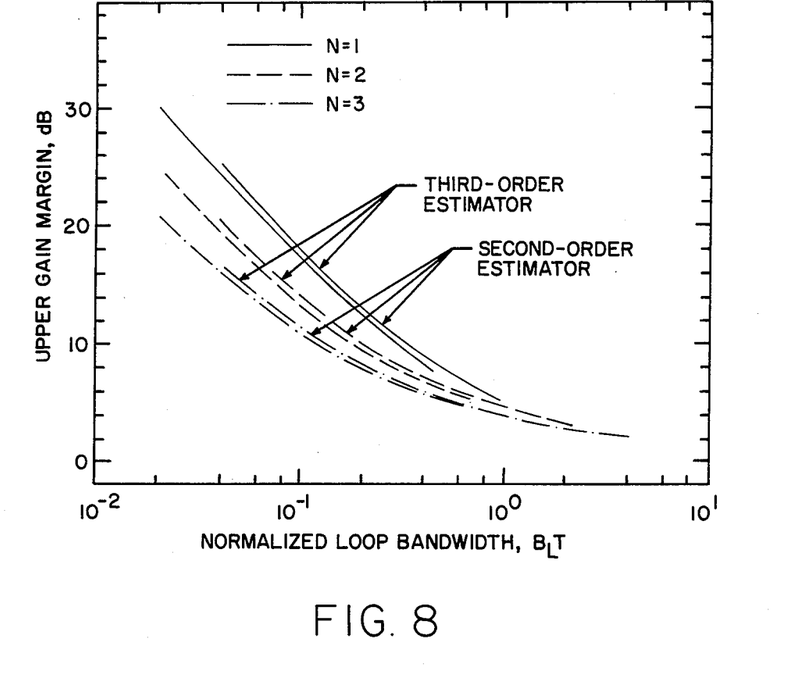
FIG. 8 is a graph of upper gain margin versus normalized loop bandwidth.
Figure 9:
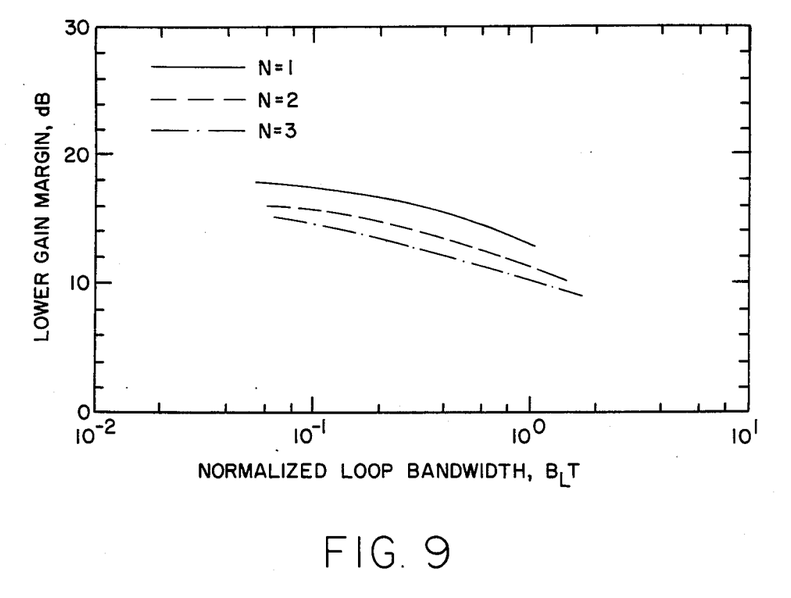
FIG. 9 is a graph of lower gain margin versus normalized loop bandwidth

Gain margin measures the effect of the phase detector gain, A, on the stability of the closed loop. It is defined as the ratio of the critical gain, i.e., gain that forces the poles of the transfer function outside the unit circle, to the nominal unity gain. FIG. 8 shows the relationship between upper gain margin and normalized bandwidth. Here, as the loop becomes wider, the gain margin decreases. Similar results are presented in FIG. 9 for the lower gain margin of the type III loop. Note that the lower gain margin for the type II loop is infinity. These figures are useful for quick design evaluation e.g., finding a favorable trade-off between any two variables.

Similar results can be obtained for a tradeoff between dyamic errors and $B_L T$. Since dynamic phase error is approximately inversely proportional to the second or third power of the normalized bandwidth, we define phase error coefficients, $C_{\phi 2}$ and $C_{\phi 3}$, so that:

$$\text{Type II: } E_\infty = \left[\frac{C_{\phi 2}}{B_L}\right]^2 \text{ acceleration} \tag{21}$$

$$\text{Type III: } E_\infty = \left[\frac{C_{\phi 3}}{B_L}\right]^3 \text{ jerk} \tag{22}$$

Figure 10:
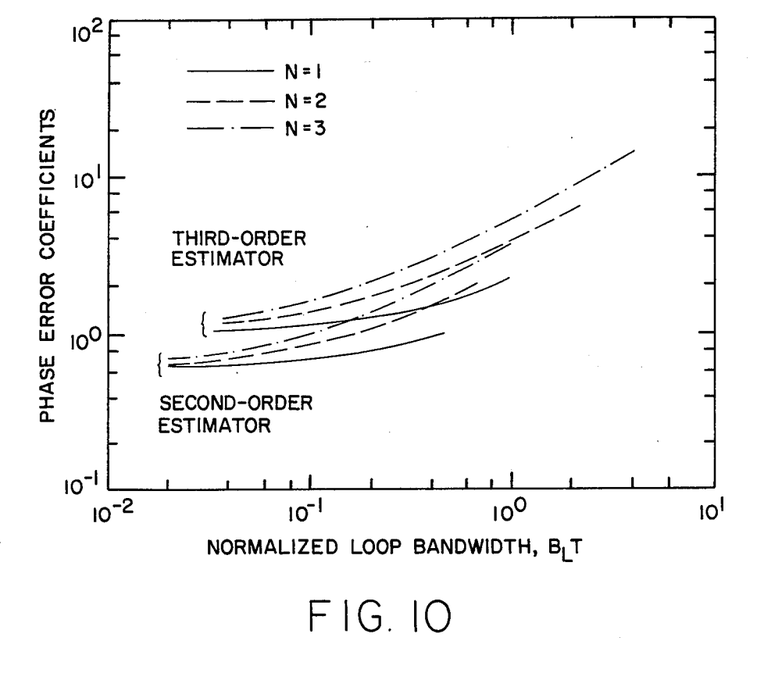
FIG. 10 is a graph of phase error coefficients versus normalized loop bandwidth.

These coefficients exhibit lower variation with $B_L T$, than the dynamic phase error. FIG. 10 shows the phase coefficients as function of normalized bandwidths. The phase coefficients, for narrow bandwidths, are less than 1 for the type II loop and between 1 and 2 for the type III loop, and they increase slowly with increased bandwidths.

Using an estimation theory approach, design of this new DPLL can be accomplished in a systematic way rather than by trial and error. The examples presented here are useful for many applications, and the resulting design curves may thus be directly applied. Still other examples and variations will occur to those skilled in the art. Consequently, the claims appended hereto are intended to encompass other equivalent examples and variations.

What is claimed is:

1. A digital phase-lock loop comprising a linear estimator means for recursive estimates of phase, frequency, and higher order derivatives, a predictor means for compensating transport lag inherent in said loop, a phase detector means with gain for comparing an input signal Q(z) with the output $\overline{Q}(z)$ of said predictor with a delay inherent in said loop, and a means for adding the output of said predictor having said inherent delay $z^{-N}$ to the output $\phi(z)$ of said detector, said loop having a closed-loop transfer function of the form $$H(z) = C(z)D(z)z^{-N}$$

where C(z) is an estimator transfer function, D(z) is a predictor function and $z^{-N}$ is said transport lag in units of loop update time inherent in said loop.

2. A digital phase-lock loop as defined in claim 1 wherein said estimator means and said predictor means with inherent transport delay are comprised of a digital filter having a transfer function S(z) and a numerically controlled oscillator having a transfer function $\overline{Q}(z)$, where said transfer function S(z) satisfies:

$$S(z) = \frac{C(z) D(z)}{\overline{Q}(z)} z^{-N}.$$

3. A digital phase-lock loop as defined in claim 2 wherein said numerically controlled oscillator, said digital filter and said adding means are implemented by a programmed digital computer, and a separate numerical controlled oscillator having a transfer function $\overline{Q}(z)$ is provided between the output of said digital filter and said phase detection means.

* * * * *